(12) United States Patent
Kim et al.

(10) Patent No.: US 8,789,856 B2
(45) Date of Patent: Jul. 29, 2014

(54) APPARATUS AND METHOD FOR HOLDING A COVER IN A CLOSED ORIENTATION

(75) Inventors: Min C C. Kim, The Colony, TX (US); Khanh Nguyen, Allen, TX (US); Mark A. Haisler, Dallas, TX (US)

(73) Assignee: General Electric Company, Schenectady, NY (US)

( * ) Notice: Subject to any disclaimer, the term of this patent is extended or adjusted under 35 U.S.C. 154(b) by 1713 days.

(21) Appl. No.: 11/566,536

(22) Filed: Dec. 4, 2006

(65) Prior Publication Data

US 2008/0129055 A1    Jun. 5, 2008

(51) Int. Cl.
| | |
|---|---|
| *E05C 19/06* | (2006.01) |
| *E05C 1/10* | (2006.01) |
| *E05B 65/00* | (2006.01) |
| *H05K 5/02* | (2006.01) |
| *E05C 19/00* | (2006.01) |
| *E05B 17/00* | (2006.01) |

(52) U.S. Cl.
CPC ............. *H05K 5/0221* (2013.01); *E05C 1/10* (2013.01); *E05B 65/006* (2013.01); *E05B 17/0037* (2013.01); *Y10S 292/11* (2013.01)
USPC ....... 292/80; 292/121; 292/163; 292/DIG. 11

(58) Field of Classification Search
USPC ........... 361/679.57, 679.58; 292/DIG. 11, 80, 292/81, 84, 87, 91, 95, 121, 163, DIG. 61; 312/215, 229, 265.6
See application file for complete search history.

(56) References Cited

U.S. PATENT DOCUMENTS

| | | | | |
|---|---|---|---|---|
| 2,670,741 A | * | 3/1954 | Nein ............................. | 40/389 |
| 2,878,389 A | * | 3/1959 | Raffman ...................... | 378/188 |
| 4,113,217 A | * | 9/1978 | O'Connell ............... | 248/222.11 |
| 5,924,782 A | * | 7/1999 | Park ............................ | 312/328 |
| 6,353,968 B1 | * | 3/2002 | Shyu et al. .................. | 16/334 |
| 6,762,928 B2 | * | 7/2004 | Lo ............................ | 361/679.58 |
| 6,935,661 B1 | * | 8/2005 | Farnsworth et al. ......... | 292/162 |
| 7,455,335 B2 | * | 11/2008 | Garneau et al. ............. | 292/144 |

* cited by examiner

*Primary Examiner* — Carlos Lugo
(74) *Attorney, Agent, or Firm* — General Electric Company

(57) ABSTRACT

An apparatus for holding a cover in a closed orientation substantially covering a chassis face of a unit; the unit containing equipment in an equipment volume; the equipment volume being partially bounded by the chassis face; includes: a positioning structure coupling the cover with the unit for selectively situating the cover in the closed orientation or in an other orientation; and a latching structure configured for latchingly engaging the chassis face and the cover for holding the cover in the closed orientation when the latching structure is in a first orientation. The latching structure does not engage the chassis face and the cover when the latching structure is in a second orientation. The latching structure is situated substantially entirely outside the equipment volume.

18 Claims, 6 Drawing Sheets

US 8,789,856 B2

APPARATUS AND METHOD FOR HOLDING A COVER IN A CLOSED ORIENTATION

BACKGROUND OF THE INVENTION

The present invention is directed to equipment containing units, and especially to equipment containing containers having a cover movable from an open orientation to a latched closed or operational orientation.

Typical prior art mechanisms employed with equipment unit covers include a latching mechanism that is in a latched orientation during normal operation of the unit. A latching spring or similar latching bias member is employed to hold the latch in a latched orientation until an operator applies a releasing force to the latching mechanism to overcome the bias of the latching spring and move the latching mechanism away from the latched orientation. Once the releasing force is removed, the latching mechanism responds to force applied by the latching bias member and returns to its latched orientation. This latching arrangement required that the latching mechanism and the latching spring be held in proper relative positions with each other and with the equipment unit while still permitting free movement of the latching mechanism into and out of the latched orientation.

There is a need for a method and apparatus that provide improved holding of the latching mechanism and latching bias member with respect to the equipment unit and with respect to each other using a single unitary structure. Such a unitary structure would be easier and therefore less expensive to manufacture. Further, such a unitary structure would be more reliable in operation than a multi-piece structure to satisfy required functions of housing and latching a latching bias member for the latching mechanism appropriate to permit the required one degree of freedom required for moving the latching mechanism into and out of a latched orientation.

The present invention is further advantageously configured for installation and operation substantially outside the equipment volume of the unit, thereby permitting additional room for equipment.

An alternate embodiment of the invention further provides a positioning bias member for urging the cover away from an operational or closed orientation toward an open orientation.

Yet another alternate embodiment of the invention provides a unitary structure that satisfies functions of latching member housing and latching member bias member as well as provides a positioning bias member for urging the cover away from an operational or closed orientation toward an open orientation.

SUMMARY OF THE INVENTION

An apparatus for holding a cover in a closed orientation substantially covering a chassis face of a unit; the unit containing equipment in an equipment volume; the equipment volume being partially bounded by the chassis face; includes: a positioning structure coupling the cover with the unit for selectively situating the cover in the closed orientation or in an other orientation; and a latching structure configured for latchingly engaging the chassis face and the cover for holding the cover in the closed orientation when the latching structure is in a first orientation. The latching structure does not engage the chassis face and the cover when the latching structure is in a second orientation. The latching structure is situated substantially entirely outside the equipment volume.

A method for holding a cover in a closed orientation substantially covering a chassis face of a unit; the unit containing equipment in an equipment volume; the equipment volume being partially bounded by the chassis face; includes: (a) in no particular order: (1) providing a positioning structure coupling the cover with the unit for selectively situating the cover in the closed orientation or in an other orientation; and (2) providing a latching structure configured for latchingly engaging the chassis face and the cover for holding the cover in the closed orientation when the latching structure is in a first orientation; the latching structure not engaging the chassis face and the cover when the latching structure is in a second orientation; the latching structure being situated substantially entirely outside the equipment volume; (b) situating the cover in the closed orientation; and (c) orienting the latching structure in the first orientation.

It is, therefore an object of the present invention to provide a method and apparatus that provide improved holding of the latching mechanism and latching bias member with respect to the equipment unit and with respect to each other using a single unitary structure.

It is another object of the present invention to provide a positioning bias member for urging the cover away from an operational or closed orientation toward an open orientation.

It is yet another object of the present invention to provide a unitary structure that satisfies functions of latching member housing and latching member bias member as well as provides a positioning bias member for urging the cover away from an operational or closed orientation toward an open orientation.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
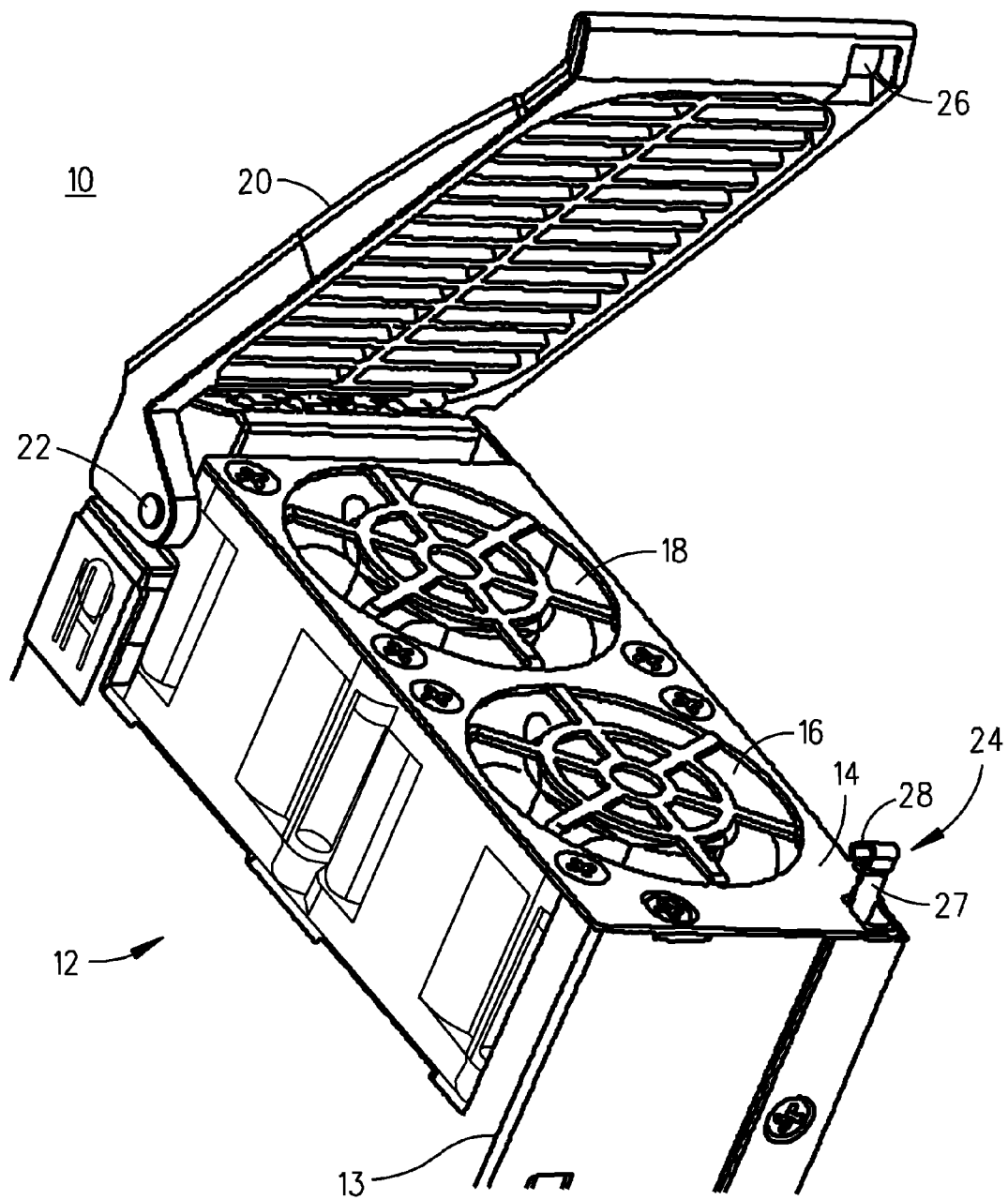
FIG. 1 is a perspective view of a portion of an equipment unit equipped with a prior art cover latch, with the cover in an open orientation.

FIG. 1 is a perspective view of a portion of an equipment unit equipped with a prior art cover latch, with the cover in an open orientation. In FIG. 1, an equipment unit 10 includes an equipment volume 12 defined in part by a cabinet 13 (shown in part in FIG. 1). Equipment is not illustrated in detail in FIG. 1. However, one skilled in the art of equipment design will recognize that various kinds of equipment may be installed in equipment volume 12. By way of example and not by way of limitation, equipment unit 10 is representatively illustrated in FIG. 1 as an electrical rectifier unit of the sort employed in the communication industry.

Equipment volume 12 is bounded at one end of cabinet 13 by a chassis face 14. Chassis face 14 is provided with vent structures 16, 18 for accommodating air flow into or out of equipment volume 12 for cooling equipment contained in equipment volume 12 (not shown in FIG. 1). A cover 20 is provided for covering chassis face 14. Cover 20 is rotatably coupled with cabinet 13 by a hinge structure 22 to permit swinging orientation of cover 20 about hinge structure 22 between an open orientation (illustrated in FIG. 1) and a closed orientation with cover 20 substantially abutting chassis face 14 and substantially in register with chassis face 14.

A latch 24 is provided in an extended orientation generally perpendicular with chassis face 14. A latch receiving aperture 26 is presented in cover 20 in a location that places latch receiving aperture 26 substantially in register with latch 24 when cover 20 is in a closed orientation. Latch 24 is configured to present a flexible arm 27 extending from chassis face 14. An engaging structure 28 is located at an end of flexible arm 27 distal from chassis face 14. As cover 20 is urged (by a user or operator) from an open orientation toward a closed orientation, engaging structure 28 comes into contact with receiving aperture 26. As cover 20 is further urged toward a closed orientation, flexible arm 27 is flexed to permit engaging structure 28 to move from an at-rest position to a flexed position as engaging structure 28 passes through receiving aperture 26. The length of flexible arm 27 is appropriate to permit engaging structure 28 to pass through receiving aperture 26 and substantially return toward its at-rest position to a latching position that is preferably between its at-rest position and its flexed position once engaging structure 28 passes through receiving aperture 26. The length of flexible arm 27 is appropriate to hold cover 20 in its closed orientation substantially in register with chassis face 14 and substantially abutting chassis face 14 with engaging structure 28 (in its latching position) interfering with movement of cover 20 from its closed orientation. To move cover 20 from its closed orientation, a user may apply a clearing force to engaging structure 28 to flex flexible arm 27 sufficiently to move engaging structure 28 to a clearance position appropriate to clear and pass through receiving aperture 26. Once engaging structure 28 is in a clearance position, the user may apply a moving force to cover 20 to urge cover 20 away from chassis face 22 while still maintaining the clearance position of engaging structure 28. When receiving aperture 26 clears engaging structure 28, the user may relax the clearing force, flexible arm 27 is relaxed and engaging structure 28 returns to its at-rest position. The user may continue to apply the moving force to further rotatably move cover 20 toward an open orientation.

One disadvantage associated with latch 24 is that it requires mounting within equipment volume 12, thereby occupying space that could be used for equipment installation, space that could be used to enhance air flow within equipment volume 12 to improve cooling of equipment, or space that could be employed for other purposes.

Figure 2:
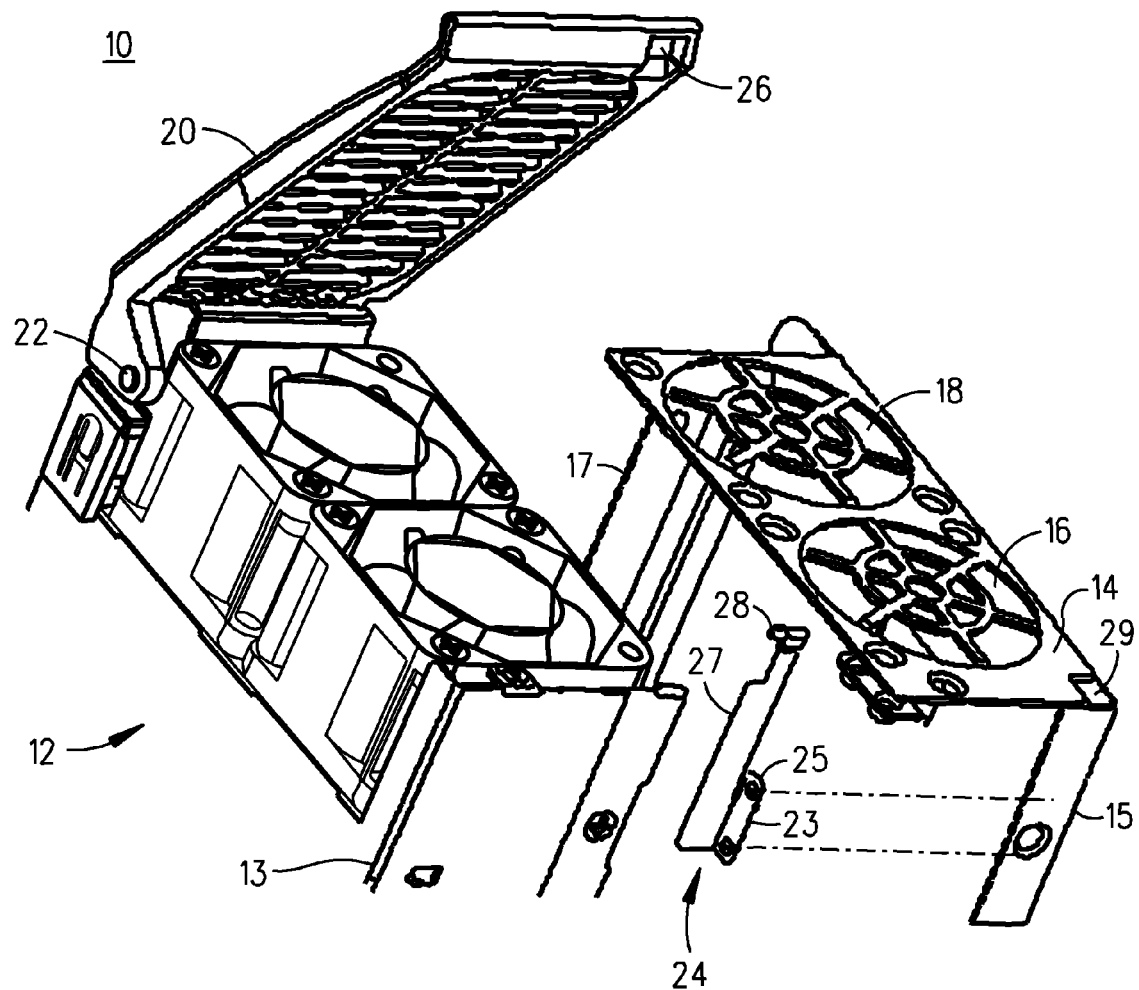
FIG. 2 is a perspective partially exploded view of the equipment unit illustrated in FIG. 1.

FIG. 2 is a perspective partially exploded view of the equipment unit illustrated in FIG. 1. In FIG. 2, equipment unit 10 includes a cabinet 13 (shown in part in FIG. 2) contributing to defining equipment volume 12. Chassis face 14 is illustrated in exploded relation with respect to cabinet 13. Chassis face 14 is coupled with chassis members 15, 17. Cover 20 is rotatably coupled with cabinet 13 by a hinge structure 22 to permit swinging orientation of cover 20 about hinge structure 22 between an open orientation (illustrated in FIG. 2) and a closed orientation with cover 20 substantially abutting chassis face 14 and substantially in register with chassis face 14.

Latch 24 is illustrated in exploded relation with respect to chassis face 14. Latch 24 may be coupled with chassis member 15 by a support portion 25. Support portion 25 is illustrated in FIG. 2 as having attachment apertures 21, 23 configured appropriately to effect mounting latch 24 with chassis member 15 using screws or rivets (not shown in FIG. 2). Other mounting techniques may as well be employed for attaching latch 24 with chassis member 15 including by way of example and not by way of limitation, welding, soldering, adhesive and forming latch member 24 integrally with chassis member 15.

Latch 24 is mounted with chassis member 15 in a position to permit latch 24 to extend through a latch aperture 29 in chassis face 14 an appropriate length to permit cooperation between latch 24 and cover 20 when moving cover 20 between an open orientation and a closed orientation as described earlier herein in connection with FIG. 1. In order to avoid prolixity, that operation will not be described again here.

Figure 3:
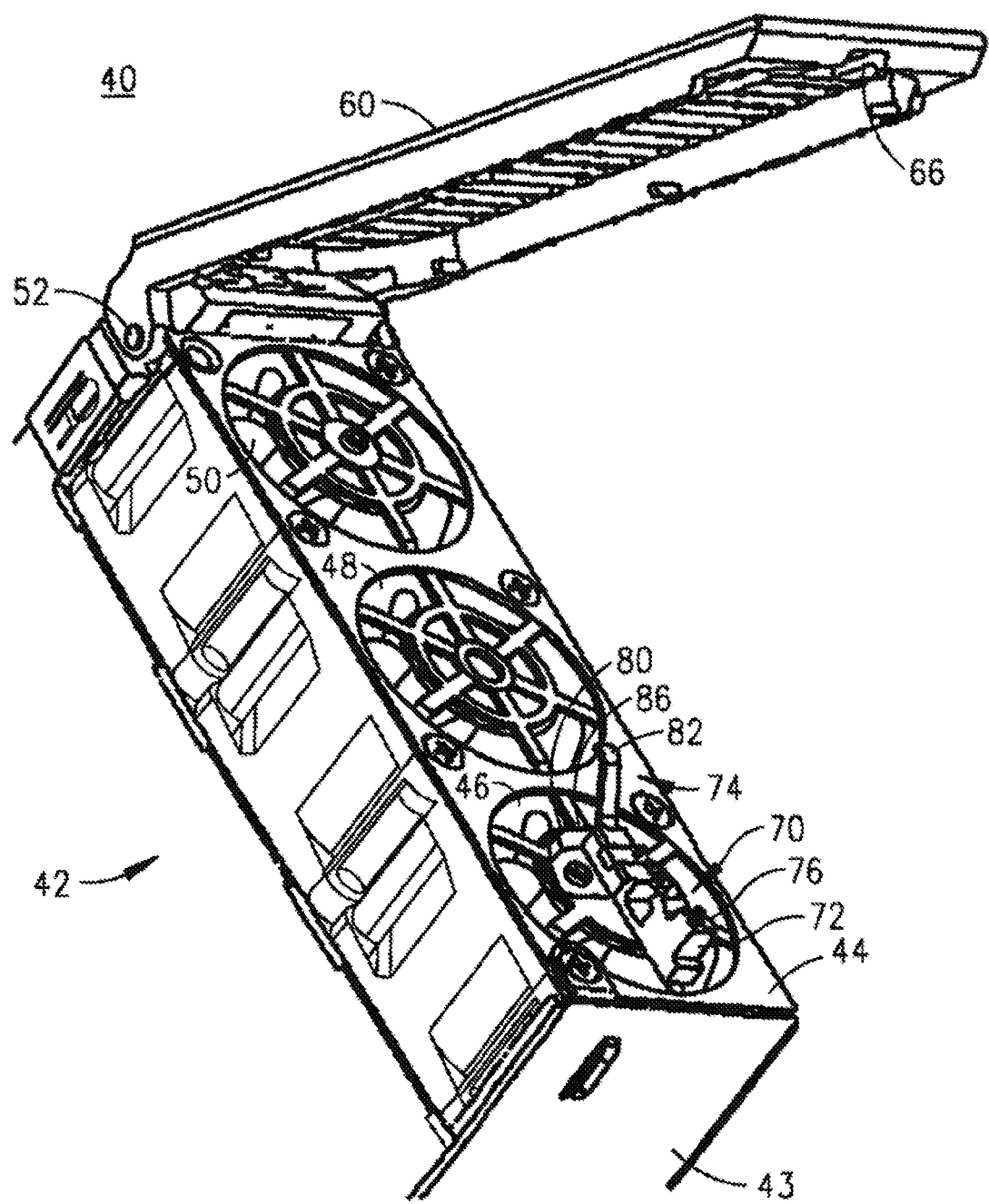
FIG. 3 is a perspective view of a portion of an equipment unit equipped with a first embodiment of a cover latch configured according to the teachings of the present invention, with the cover in an open orientation.

FIG. 3 is a perspective view of a portion of an equipment unit equipped with a first embodiment of a cover latch configured according to the teachings of the present invention, with the cover in an open orientation. In FIG. 3, an equipment unit 40 includes an equipment volume 42 defined in part by a cabinet 43 (shown in part in FIG. 3). Equipment is not illustrated in detail in FIG. 3. However, one skilled in the art of equipment design will recognize that various kinds of equipment may be installed in equipment volume 42. By way of example and not by way of limitation, equipment unit 40 is representatively illustrated in FIG. 3 as an electrical rectifier unit of the sort employed in the communication industry.

Equipment volume 42 is bounded at one end of cabinet 43 by a chassis face 44. Chassis face 44 is provided with vent structures 46, 48, 50 for accommodating air flow into or out of equipment volume 42 for cooling equipment contained in equipment volume 42 (not shown in FIG. 3). A cover 60 is provided for covering chassis face 44. Cover 60 is rotatably coupled with cabinet 43 by a hinge structure 52 to permit swinging orientation of cover 60 about hinge structure 52 between an open orientation (illustrated in FIG. 3) and a closed orientation with cover 60 substantially abutting chassis face 44 and substantially in register with chassis face 44.

Figure 4:
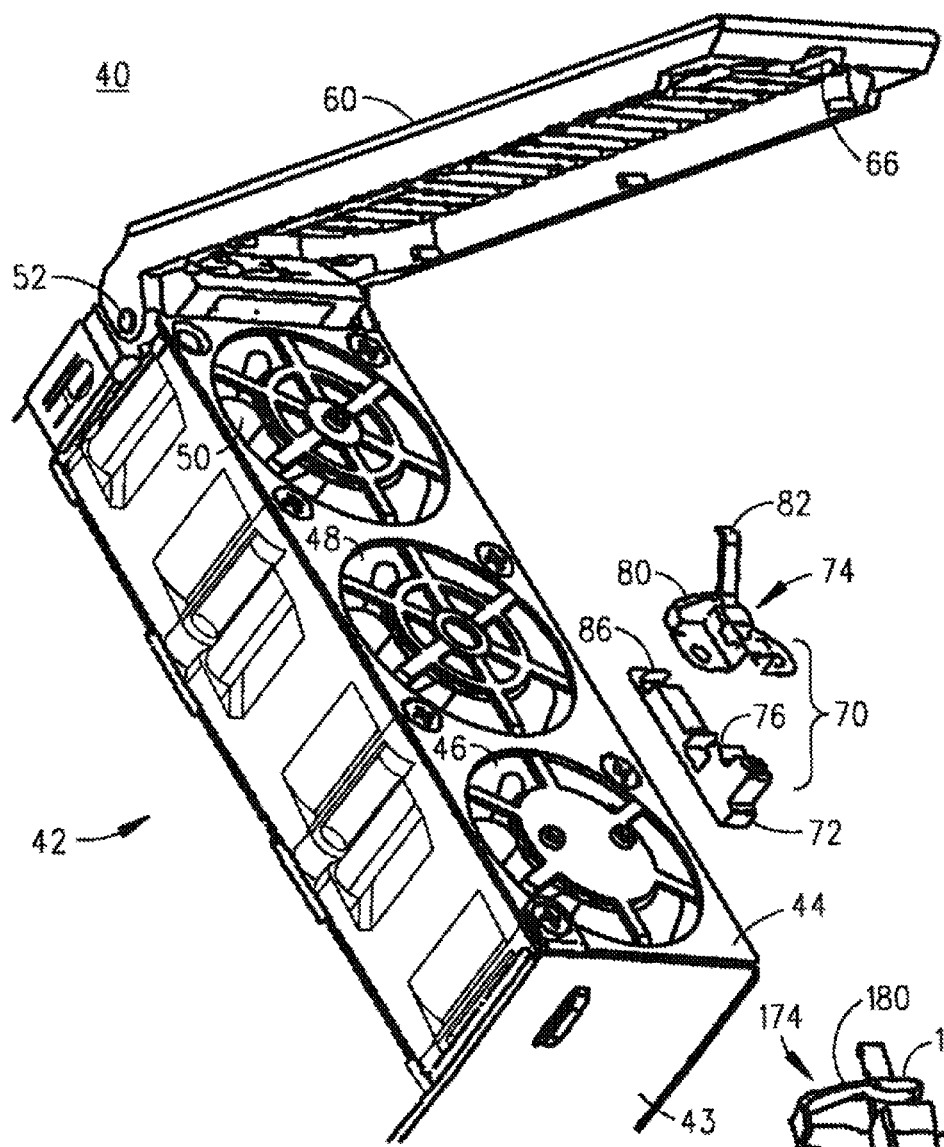
FIG. 4 is a perspective partially exploded view of the equipment unit illustrated in FIG. 3.

A latch assembly 70 is provided for holding cover 60 in the closed orientation. Latch assembly 70 is a two piece assembly (see exploded view; FIG. 4) including an engaging structure 72 and a biasing structure or positioning structure 74. Biasing structure or positioning structure 74 may be referred to as a positioning bias member 74. In the embodiment of the invention illustrated in FIG. 3 (and in FIG. 4) biasing structure 74 is configured in a unitary structure including a latching bias member 80 for providing a latching bias force to engaging structure 72 and including a positioning bias member 82 for providing a positioning bias force to urge cover 60 toward an open orientation.

Biasing structure 74 is affixed with chassis face 44 in a straddling captive orientation with respect to engaging structure 72 so as to permit engaging structure 72 to move, preferably substantially along a single axis (i.e., with preferably substantially one degree of freedom) while held captive by biasing structure 74 and chassis face 44. Latching bias member 80 bears against a provided wall 86 (or similar portion) of engaging structure 72 to provide a bias force resisting movement of engaging structure 72 from an at-rest position. Positioning bias member 82 is oriented to be moved from an unflexed position to a flexed position when cover 60 is moved from an open position to its closed orientation. Positioning bias member 82 therefore applies a positioning bias force against cover 60 urging cover 60 away from its closed orientation when cover 60 is in its closed orientation.

Latch assembly 70 is installed in an orientation establishing engaging structure 72 extending a latch structure 76 in a direction away from chassis face 44 toward cover 60. A latch receiving aperture or structure 66 is presented in cover 60 in a location that places latch receiving aperture 66 substantially in register with latch structure 76 when cover 60 is in a closed orientation. As cover 60 is urged (by a user or operator) from an open orientation toward a closed orientation, latch aperture 66 comes into contact with latch structure 76. As cover 60 is further urged toward a closed orientation, engaging structure 72 is urged against bias exerted by biasing structure 74 to permit latch structure 76 to move from an at-rest position to a flexed position as latch structure 76 passes through receiving aperture 66. Latch structure 76 extends an appropriate distance from chassis the 44 to permit latch structure 76 to pass through receiving aperture 66 and substantially return toward its at-rest position to a latching position that is preferably between its at-rest position and its flexed position once latch structure 76 passes through receiving aperture 66. The reach of latch structure 76 from chassis the 44 is preferably appropriate to hold cover 60 in its closed orientation substantially in register with chassis face 44 and substantially abutting chassis face 44 with latch structure 76 (in its latching position) interfering with movement of cover 60 from its closed orientation.

To move cover 60 from its closed orientation, a user must apply a clearing force to latch structure 76 to flex latching bias member 80 sufficiently to move latch structure 76 to a clearance position appropriate to clear and pass through receiving aperture 66. Once latch structure 76 is in a clearance position, a positioning bias force provided by positioning bias member 82 will urge cover 60 away from chassis face 44. When receiving aperture 66 clears latch structure 76, the user may relax the clearing force, latching bias member 80 is relaxed and latch structure 76 returns to its at-rest position.

One advantage associated with latch assembly 70 is that it is mounted entirely outside of equipment volume 42 thereby leaving available space that may be advantageously employed for equipment installation, employed to enhance air flow within equipment volume 12 to improve cooling of equipment, or employed for other purposes.

FIG. 4 is a perspective partially exploded view of the equipment unit illustrated in FIG. 3. In FIG. 4, equipment unit 40 includes equipment volume 42 defined in part by cabinet 43 (shown in part in FIG. 4). Equipment volume 42 is bounded at one end of cabinet 43 by chassis face 44. Cover 60 is rotatably coupled with cabinet 43 by hinge structure 52 to permit swinging orientation of cover 60 about hinge structure 52 between an open orientation (illustrated in FIG. 4) and a closed orientation with cover 60 substantially abutting chassis face 44 and substantially in register with chassis face 44.

Latch assembly 70 is illustrated in FIG. 4 in an exploded orientation. Latch assembly 70 includes engaging structure 72 and biasing structure 74. Biasing structure 74 is configured in a unitary structure including latching bias member 80 for providing a latching bias force to engaging structure 72 and including positioning bias member 82 for providing a positioning bias force to urge cover 60 toward an open orientation.

Biasing structure 74 is illustrated in FIG. 4 in an exploded position poised for assembly with chassis face 44 in a straddling captive orientation with respect to engaging structure 72 so as to permit engaging structure 72 to move, preferably substantially along a single axis (i.e., with preferably substantially one degree of freedom) while engaging structure 72 is held captive by biasing structure 74 in cooperation with chassis face 44. Latching bias member 80 bears against wall 86 of engaging structure 72 to provide a bias force resisting movement of engaging structure 72 from an at-rest position. Latching bias member 80 may bear against another portion of engaging structure 72 if desired. Positioning bias member 82 is oriented to be moved from an unflexed position to a flexed position when cover 60 is moved from an open position to its closed orientation. Positioning bias member 82 therefore applies a positioning bias force against cover 60 urging cover 60 away from its closed orientation when cover 60 is in its closed orientation.

Latch assembly 70 includes latch structure 76 extending in a direction away from chassis face 44 toward cover 60 when latch assembly 70 is installed with chassis face 44. Latch receiving aperture 66 is presented in cover 60 in a location substantially in register with latch structure 76 when cover 60 is in a closed orientation. As cover 60 is urged (by a user or operator) from an open orientation toward a closed orientation, latch aperture 66 cooperates with latch structure 76 to effect latching of cover 60 in a closed orientation, as described earlier in connection with FIG. 3.

Figure 5:
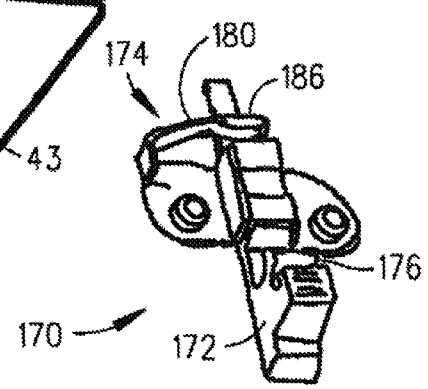
FIG. 5 is a perspective view of a latching apparatus configured according to a second embodiment of the present invention.

FIG. 5 is a perspective view of a latching apparatus configured according to a second embodiment of the present invention. In FIG. 5, a latch assembly 170 is a two piece assembly including an engaging structure 172 and a biasing structure 174. Biasing structure 174 is configured in a unitary structure including a latching bias member 180 for providing a latching bias force to engaging structure 172. The unitary structure of biasing structure does not include an integral positioning bias member.

Biasing structure 174 is affixed with a chassis face 144 (see FIG. 6) in a straddling captive orientation with respect to engaging structure 172 so as to permit engaging structure 172 to move, preferably substantially along a single axis (i.e., with preferably substantially one degree of freedom) while held captive by biasing structure 174 and chassis face 144. Latching bias member 180 bears against a provided wall 186 (or similar portion) of engaging structure 172 to provide a bias force resisting movement of engaging structure 172 from an at-rest position. Latch assembly 70 is installed in an orientation illustrated in FIG. 6.

Figure 6:
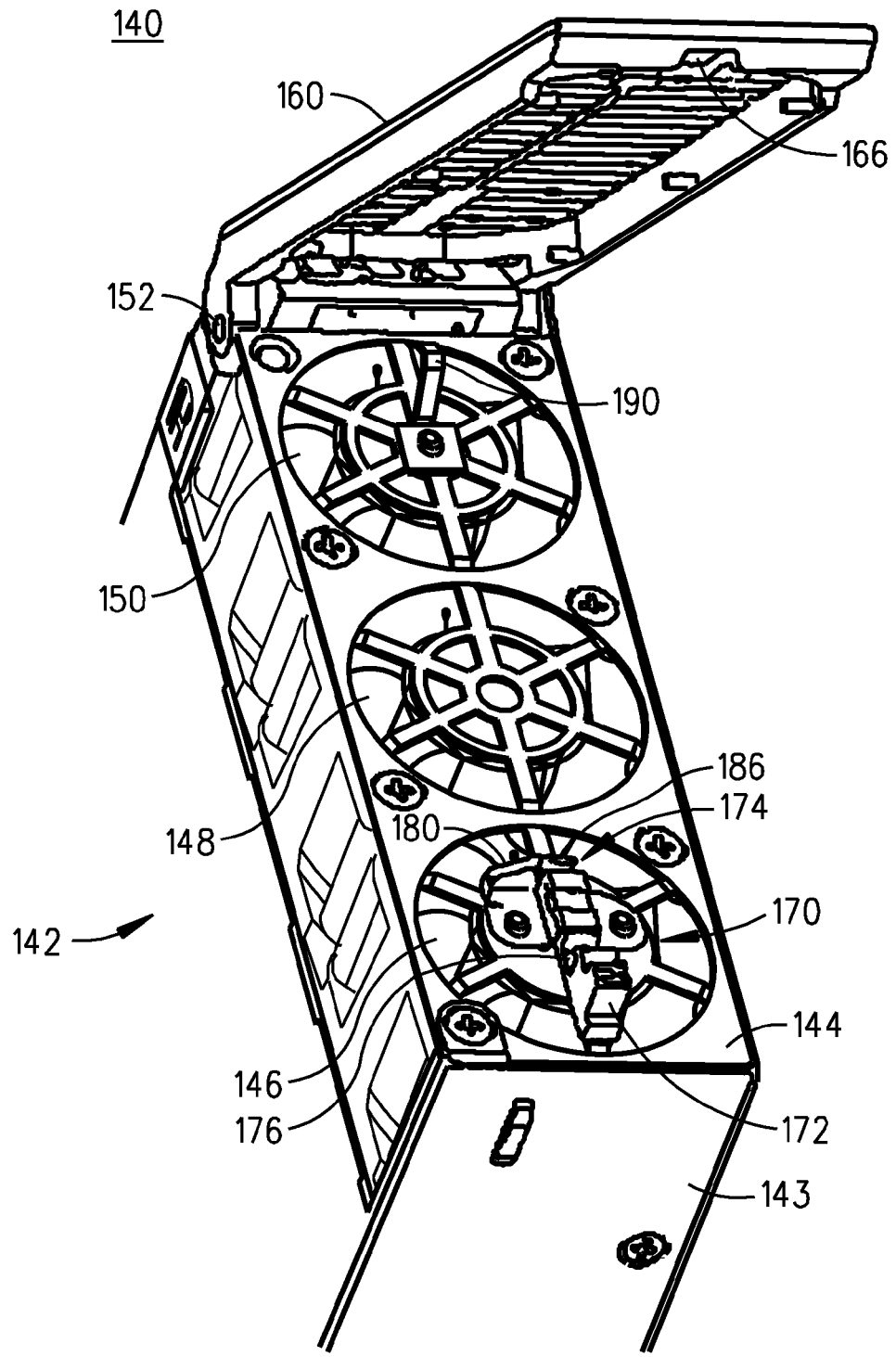
FIG. 6 is a perspective view of a portion of an equipment unit equipped with the second embodiment of a cover latch illustrated in FIG. 5, with the cover in an open orientation.

FIG. 6 is a perspective view of a portion of an equipment unit equipped with the second embodiment of a cover latch illustrated in FIG. 5, with the cover in an open orientation. In FIG. 6, an equipment unit 140 includes an equipment volume 142 defined in part by a cabinet 143 (shown in part in FIG. 6). Equipment is not illustrated in detail in FIG. 6. However, one skilled in the art of equipment design will recognize that various kinds of equipment may be installed in equipment volume 142. By way of example and not by way of limitation, equipment unit 140 is representatively illustrated in FIG. 6 as an electrical rectifier unit of the sort employed in the communication industry.

Equipment volume 142 is bounded at one end of cabinet 143 by a chassis face 144. Chassis face 144 is provided with vent structures 146, 148, 150 for accommodating air flow into or out of equipment volume 142 for cooling equipment contained in equipment volume 142 (not shown in FIG. 6). A cover 160 is provided for covering chassis face 144. Cover 160 is rotatably coupled with cabinet 143 by a hinge structure 152 to permit swinging orientation of cover 160 about hinge structure 152 between an open orientation (illustrated in FIG.

6) and a closed orientation with cover 160 substantially abutting chassis face 144 and substantially in register with chassis face 144.

A latch assembly 170 is provided for holding cover 160 in the closed orientation. Latch assembly 170 is a two piece assembly (see exploded view; FIG. 5) including an engaging structure 172 and a biasing structure 174. In the embodiment of the invention illustrated in FIG. 6 (and in FIG. 5) biasing structure 174 is configured in a unitary structure including a latching bias member 180 for providing a latching bias force to engaging structure 172.

A positioning bias member 190 is affixed with chassis face 144 at a locus remote from latching assembly 170. In the exemplary embodiment illustrated in FIG. 6, positioning bias member 190 is affixed with chassis face 144 in the vicinity of vent structure 150. Alternatively, by way of example and not by way of limitation, positioning bias member 190 may be affixed with chassis face 144 in the vicinity of vent structure 148 or elsewhere on chassis face 144 so long as positioning bias member 190 provides a positioning bias force to urge cover 160 toward an open orientation when cover 160 is in a closed position. Preferably, positioning bias member 190 is oriented to be moved from an unflexed position to a flexed position when cover 160 is moved from an open position to its closed orientation. Positioning bias member 190 therefore applies a positioning bias force against cover 160 urging cover 160 away from its closed orientation when cover 160 is in its closed orientation.

Biasing structure 174 is affixed with chassis face 144 in a straddling captive orientation with respect to engaging structure 172 so as to permit engaging structure 172 to move, preferably substantially along a single axis (i.e., with preferably substantially one degree of freedom) while held captive by biasing structure 174 and chassis face 144. Latching bias member 180 bears against a provided wall 186 (or similar portion) of engaging structure 172 to provide a bias force resisting movement of engaging structure 172 from an at-rest position.

Latch assembly 170 is installed in an orientation establishing engaging structure 172 extending a latch structure 176 in a direction away from chassis face 144 toward cover 160. A latch receiving aperture 166 is presented in cover 160 in a location that places latch receiving aperture 166 substantially in register with latch structure 176 when cover 160 is in a closed orientation. As cover 160 is urged (by a user or operator) from an open orientation toward a closed orientation, latch aperture 166 comes into contact with latch structure 176. As cover 160 is further urged toward a closed orientation, engaging structure 172 is urged against bias exerted by biasing structure 174 to permit latch structure 176 to move from an at-rest position to a flexed position as latch structure 176 passes through receiving aperture 166. Latch structure 176 extends an appropriate distance from chassis face 144 to permit latch structure 176 to pass through receiving aperture 166 and substantially return toward its at-rest position to a latching position that is preferably between its at-rest position and its flexed position once latch structure 176 passes through receiving aperture 166. The reach of latch structure 176 from chassis face 144 is preferably appropriate to hold cover 160 in its closed orientation substantially in register with chassis face 144 and substantially abutting chassis face 144 with latch structure 176 (in its latching position) interfering with movement of cover 160 from its closed orientation.

To move cover 160 from its closed orientation, a user must apply a clearing force to latch structure 176 to flex latching bias member 180 sufficiently to move latch structure 176 to a clearance position appropriate to clear and pass through receiving aperture 166. Once latch structure 176 is in a clearance position, a positioning bias force provided by positioning bias member 190 will urge cover 160 away from chassis face 144. When receiving aperture 166 clears latch structure 176, the user may relax the clearing force, latching bias member 180 is relaxed and latch structure 176 returns to its at-rest position.

Figure 7:
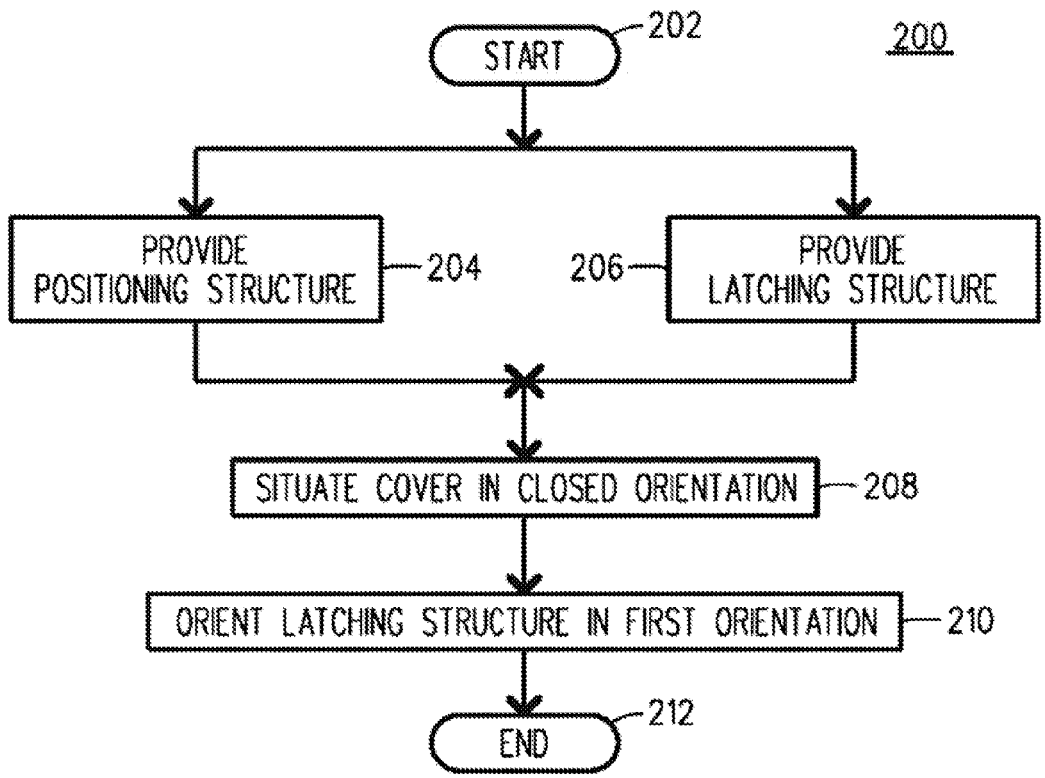
FIG. 7 is a flow chart illustrating the method of the present invention.

FIG. 7 is a flow chart illustrating the method of the present invention. In FIG. 7, a method 200 for holding a cover in a closed orientation substantially covering a chassis face of a unit begins at a START locus 202. The unit contains equipment in an equipment volume. The equipment volume is partially bounded by the chassis face. Method 200 continues with, in no particular order: (1) providing a positioning structure coupling the cover with the unit for selectively situating the cover in the closed orientation or in an other orientation, as indicated by a block 204; and (2) providing a latching structure configured for latchingly engaging the chassis face and the cover for holding the cover in the closed orientation when the latching structure is in a first orientation, as indicated by a block 206. The latching structure does not engage the chassis face and the cover when the latching structure is in a second orientation. The latching structure is situated substantially entirely outside the equipment volume.

Method 200 continues by situating the cover in the closed orientation, as indicated by a block 208. Method 200 continues by orienting the latching structure in the first orientation, as indicated by a block 210. Method 200 terminates at an END locus 212.

Figure 8:
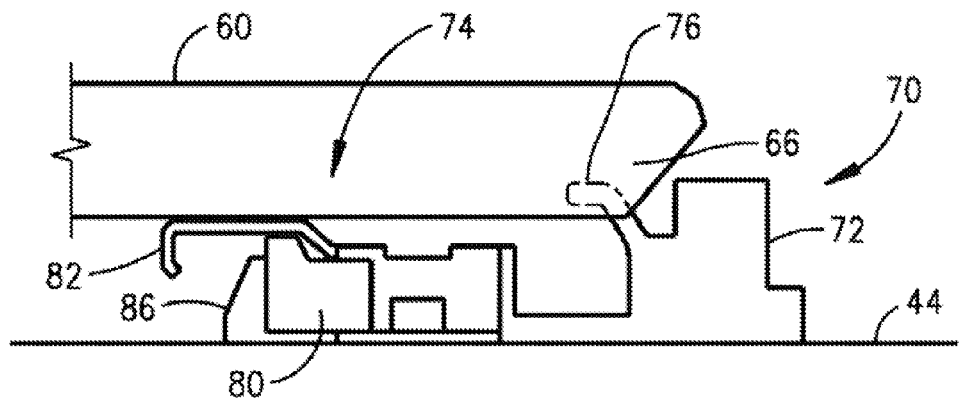
FIG. 8 is a partial side view of the equipment unit illustrated in FIG. 3 in a closed orientation.

FIG. 8 is a partial side view of the equipment unit illustrated in FIG. 3 in a closed orientation. In FIG. 8, operating mechanism 71 includes a latch assembly 70 and a latch receiving structure 66. Latch assembly 70 is a two piece assembly (see exploded view; FIG. 4) including engaging structure 72 and biasing structure or positioning structure 74. Biasing structure or positioning structure 74 may be referred to as a positioning bias member 74. Biasing structure 74 may be configured in a unitary structure including latching bias member 80 and positioning bias member 82 for providing a positioning bias force to urge cover 60 toward an open orientation.

Biasing structure 74 is affixed with chassis face 44 in a straddling captive orientation with respect to engaging structure 72 so as to permit engaging structure 72 to move, preferably substantially along a single axis (i.e., with preferably substantially one degree of freedom) while held captive by biasing structure 74 and chassis face 44. Latching bias member 80 bears against wall 86 of engaging structure 72 to provide a bias force resisting movement of engaging structure 72 from an at-rest position. Positioning bias member 82 is oriented to be moved from an unflexed position to a flexed position when cover 60 is moved from an open position to its closed orientation. Positioning bias member 82 therefore applies a positioning bias force against cover 60 urging cover 60 away from its closed orientation when cover 60 is in its closed orientation.

Latch assembly 70 is installed in an orientation establishing engaging structure 72 extending latch structure 76 in a direction away from chassis face 44 toward cover 60. Latch receiving aperture 66 is presented in cover 60 in a location that places latch receiving aperture 66 substantially in register with latch structure 76 when cover 60 is in a closed orientation. As cover 60 is urged (by a user or operator) from an open orientation toward a closed orientation, latch aperture 66 comes into contact with latch structure 76. As cover 60 is further urged toward a closed orientation, engaging structure 72 is urged against bias exerted by biasing structure 74 to permit latch structure 76 to move from an at-rest position to a flexed position as latch structure 76 passes through receiving aperture 66. Latch structure 76 extends an appropriate distance from chassis face 44 to permit latch structure 76 to pass through receiving aperture 66 and substantially return toward its at-rest position to a latching position that is preferably between its at-rest position and its flexed position once latch structure 76 passes through receiving aperture 66. The reach of latch structure 76 from chassis face 44 is preferably appropriate to hold cover 60 in its closed orientation substantially in register with chassis face 44 and substantially abutting chassis face 44 with latch structure 76 (in its latching position) interfering with movement of cover 60 from its closed orientation.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. An apparatus for latching a cover into a closed orientation with respect to a unit; said unit containing equipment within a volume and presenting a chassis face toward said cover with said cover generally in register with said chassis face in said closed orientation; said cover being rotatably affixed with said unit at a first end for swinging movement between an open orientation and said closed orientation; the apparatus comprising:

a receiving aperture and an engaging structure; said engaging structure being substantially entirely situated between said chassis face and said cover in said closed orientation such that said engaging structure does not extend into said volume of said unit; and said receiving aperture and said engaging structure cooperating to orient said engaging structure for holding said cover in said closed orientation when said receiving aperture and said engaging structure are in a first orientation with said engaging structure extending within said receiving aperture in a latching position; said receiving aperture and said engaging structure cooperating to release said holding of said cover when said receiving aperture and said engaging structure are in a second orientation with said engaging structure outside said receiving aperture; and a latching bias member coupled to and oriented substantially parallel with said chassis face, said engaging structure coupled to said latching bias member, said latching bias member urging said engaging structure toward said first orientation.

2. An apparatus for latching a cover into a closed orientation with respect to a unit as recited in claim 1 wherein the apparatus further comprises:

a positioning bias member coupled with at least one of said chassis face and said engaging structure; said positioning bias member urging said cover away from said closed orientation.

3. An apparatus for latching a cover into a closed orientation with respect to a unit as recited in claim 2 wherein said latching bias member and said positioning bias member are configured in a unitary bias member.

4. An apparatus for holding a cover in a closed orientation substantially covering a chassis face of a unit; said unit containing equipment in an equipment volume; said equipment volume being partially bounded by said chassis face; the apparatus comprising:

a positioning structure coupled to said chassis face, said positioning structure configured to provide at least one biasing force for selectively situating said cover in said closed orientation or in another orientation; and a latching structure coupled between said positioning structure and said chassis face, said latching structure configured for latchingly engaging said chassis face and said cover for holding said cover in said closed orientation when said latching structure is in a first orientation with said latching structure extending within an aperture in said cover in a latching position; said chassis face being substantially planar in the vicinity of said latching structure; said latching structure not engaging said chassis face and said cover when said latching structure is in a second orientation with said latching structure not extending within said aperture; said latching structure being situated substantially entirely outside said equipment volume such that said latching structure does not extend into said equipment volume, and substantially between said chassis face and said cover in said first orientation.

5. An apparatus for holding a cover in a closed orientation substantially covering a chassis face of a unit as recited in claim 4 wherein said positioning structure is configured for effecting swinging movement of said cover with respect to said chassis face between said closed orientation and said other orientation.

6. An apparatus for holding a cover in a closed orientation substantially covering a chassis face of a unit as recited in claim 5 wherein said positioning structure further comprises:

a latching bias member coupled with at least one of said latching structure and said chassis face; said latching bias member urging said latching structure toward said first orientation.

7. An apparatus for holding a cover in a closed orientation substantially covering a chassis face of a unit as recited in claim 6 wherein the apparatus further comprises:

a positioning bias member coupled with at least one of said chassis face and said latching structure; said positioning bias member urging said cover away from said closed orientation.

8. An apparatus for holding a cover in a closed orientation substantially covering a chassis face of a unit as recited in claim 7 wherein said latching bias member and said positioning bias member are configured in a unitary bias member.

9. An apparatus for holding a cover in a closed orientation substantially covering a chassis face of a unit as recited in claim 5 wherein the apparatus further comprises:

a positioning bias member coupled with at least one of mid cover, said chassis face and said latching structure; said positioning bias member urging said cover away from said closed orientation.

10. An apparatus for holding a cover in a closed orientation substantially covering a chassis face of a unit as recited in claim 4 wherein said positioning structure further comprises:

a latching bias member coupled with at least one of said latching structure, said cover and said chassis face; said latching bias member urging said latching structure toward said first orientation.

11. An apparatus for holding a cover in a closed orientation substantially covering a chassis face of a unit as recited in claim 10 wherein the apparatus further comprises:

a positioning bias member coupled with at least one of said chassis face and said latching structure; said positioning bias member urging said cover away from said closed orientation.

12. An apparatus for holding a cover in a closed orientation substantially covering a chassis face of a unit as recited in claim 11 wherein said latching bias member and said positioning bias member are configured in a unitary bias member.

13. An apparatus for holding a cover in a closed orientation substantially covering a chassis face of a unit as recited in claim 4 wherein the apparatus further comprises:
   a positioning bias member coupled with at least one of said chassis face and said latching structure; said positioning bias member urging said cover away from said closed orientation.

14. A method for holding a cover in a closed orientation substantially covering a chassis face of a unit; said unit containing equipment in an equipment volume; said equipment volume being partially bounded by said chassis face; the method comprising:
   (a) providing a positioning structure coupled to said chassis face, said positioning structure configured to provide at least one biasing force for selectively situating said cover in said closed orientation or in another orientation; and providing a latching structure coupled between said positioning structure and said chassis face, said latching structure configured for latchingly engaging said chassis face and said cover for holding said cover in said closed orientation when said latching structure is in a first orientation with said latching structure extending within an aperture in said cover in a latching position; said latching structure not engaging said chassis face and said cover when said latching structure is in a second orientation with said latching structure not extending within said aperture; said chassis face being substantially planar in the vicinity of said latching structure; said latching structure being situated substantially entirely outside said equipment volume such that said latching structure does not extend into said equipment volume;
   (b) situating said cover in said closed orientation; and
   (c) orienting said latching structure in said first orientation.

15. A method for holding a cover in a closed orientation substantially covering a chassis face of a unit as recited in claim 14 wherein providing a positioning structure further comprises:
   providing said positioning structure with a latching bias member coupled with at least one of said latching structure and said chassis face; said latching bias member being oriented for urging said latching structure toward said first orientation.

16. A method for holding a cover in a closed orientation substantially covering a chassis face of a unit as recited in claim 14 wherein the method further comprises:
   providing a positioning bias member coupled with at least one of said cover and said chassis face and said latching structure; said positioning bias member oriented for urging said cover away from said closed orientation.

17. A method for holding a cover in a closed orientation substantially covering a chassis face of a unit as recited in claim 15 wherein the method further comprises:
   providing a positioning bias member coupled with at least one of said cover and said chassis face and said latching structure; said positioning bias member oriented for urging said cover away from said closed orientation.

18. A method for holding a cover in a closed orientation substantially covering a chassis face of a unit as recited in claim 17 wherein said latching bias member and said positioning bias member are configured in a unitary bias member.

* * * * *

UNITED STATES PATENT AND TRADEMARK OFFICE
CERTIFICATE OF CORRECTION

| | | |
|---|---|---|
| PATENT NO. | : 8,789,856 B2 | Page 1 of 1 |
| APPLICATION NO. | : 11/566536 | |
| DATED | : July 29, 2014 | |
| INVENTOR(S) | : Kim et al. | |

It is certified that error appears in the above-identified patent and that said Letters Patent is hereby corrected as shown below:

Title page, item (75), under "Inventors", in Column 1, Line 1, delete "Min C C." and insert -- Min C. --, therefor.

Specification

In Column 3, Line 47, delete "chassis face 22" and insert -- chassis face 14 --, therefor.

In Column 5, Line 20, delete "chassis the 44" and insert -- chassis face 44 --, therefor.

In Column 5, Line 25, delete "chassis the 44" and insert -- chassis face 44 --, therefor.

Claims

In Column 10, Lines 50-51, in Claim 9, delete "one of mid cover, said" and insert -- one of said --, therefor.

In Column 10, Line 58, in Claim 10, delete "structure, said cover and" and insert -- structure and --, therefor.

Signed and Sealed this
Twenty-seventh Day of October, 2015

Michelle K. Lee
*Director of the United States Patent and Trademark Office*